(12) United States Patent
Wang

(10) Patent No.: US 11,545,958 B2
(45) Date of Patent: Jan. 3, 2023

(54) FBAR STRUCTURE HAVING SINGLE CRYSTALLINE PIEZOELECTRIC LAYER AND FABRICATING METHOD THEREOF

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/649,476

(22) Filed: Jan. 31, 2022

(65) Prior Publication Data

US 2022/0158617 A1 May 19, 2022

Related U.S. Application Data

(63) Continuation of application No. 17/563,630, filed on Dec. 28, 2021.

(51) Int. Cl.
| | |
|---|---|
| *H03H 9/17* | (2006.01) |
| *H03H 3/02* | (2006.01) |
| *H03H 9/02* | (2006.01) |
| *H03H 9/13* | (2006.01) |

(52) U.S. Cl.
CPC .............. *H03H 9/173* (2013.01); *H03H 3/02* (2013.01); *H03H 9/02031* (2013.01); *H03H 9/02125* (2013.01); *H03H 9/13* (2013.01); *H03H 9/176* (2013.01); *H03H 2003/021* (2013.01)

(58) Field of Classification Search
CPC .... H03H 9/173; H03H 9/02031; H03H 9/176; H03H 9/13; H03H 9/02125
See application file for complete search history.

(56) References Cited

U.S. PATENT DOCUMENTS

| | | | |
|---|---|---|---|
| 2005/0142888 A1* | 6/2005 | Ebuchi | H03H 3/02 438/738 |
| 2006/0098059 A1* | 5/2006 | Ohguro | H01L 41/0973 257/E27.006 |
| 2016/0118324 A1* | 4/2016 | Guo | H03H 9/1014 257/737 |
| 2017/0338799 A1* | 11/2017 | Ruby | H03H 9/171 |
| 2018/0309427 A1* | 10/2018 | Kim | H03H 9/02118 |
| 2020/0176666 A1* | 6/2020 | Lee | H03H 9/13 |
| 2020/0212884 A1* | 7/2020 | Shin | H03H 9/173 |
| 2020/0313648 A1 | 10/2020 | Wang | |

FOREIGN PATENT DOCUMENTS

| | | |
|---|---|---|
| CN | 107342748 A | 11/2017 |
| CN | 111130484 A | 5/2020 |
| CN | 113572448 A | 10/2021 |

* cited by examiner

*Primary Examiner* — Bryan P Gordon

(74) *Attorney, Agent, or Firm* — Finnegan, Henderson, Farabow, Garrett & Dunner, LLP

(57) ABSTRACT

A film bulk acoustic resonator (FBAR) structure includes a bottom cap wafer, a piezoelectric layer disposed on the bottom cap wafer, the piezoelectric layer including a single crystalline piezoelectric material, a bottom electrode disposed below the piezoelectric layer; a top electrode disposed above the piezoelectric layer; and a cavity disposed below the bottom electrode.

19 Claims, 15 Drawing Sheets

FBAR STRUCTURE HAVING SINGLE CRYSTALLINE PIEZOELECTRIC LAYER AND FABRICATING METHOD THEREOF

CROSS-REFERENCE TO RELATED APPLICATION

This application is a continuation application of U.S. application Ser. No. 17/563,630 filed on Dec. 28, 2021, the content of which is hereby incorporated by reference in its entirety.

FIELD OF THE DISCLOSURE

The present disclosure relates to the field of semiconductor devices and, in particular, to a film bulk acoustic resonator (FBAR) structure having a single crystalline piezoelectric layer and a method of fabricating such a FBAR structure.

BACKGROUND

A film bulk acoustic resonator (FBAR) is a device including a thin film that is made of a piezoelectric material and disposed between two electrodes. The FBAR device is typically fabricated using semiconductor micro-processing technology.

Due to its small thickness, the FBAR device may be used in applications requiring high frequency, small size, and light weight. An exemplary application of the FBAR device is a filter used in mobile communication devices.

The FBAR device usually includes a piezoelectric layer grown on a silicon substrate. However, due to the lattice mismatch between the piezoelectric layer and the silicon substrate, the quality of the piezoelectric layer may not be high enough for achieving superior performance of the FBAR device.

Therefore, there is a need for a large-scale commercial mass production solution for producing a high-quality piezoelectric layer.

SUMMARY

Embodiments of the present disclosure provide a film bulk acoustic resonator (FBAR) structure. The FBAR structure may include a bottom cap wafer; a piezoelectric layer disposed on the bottom cap wafer, the piezoelectric layer including a single crystalline piezoelectric material; a bottom electrode disposed below the piezoelectric layer; a top electrode disposed above the piezoelectric layer; and a cavity disposed below the bottom electrode.

The single crystalline piezoelectric material may have a crystallinity of less than 0.5 degrees at Full Width Half Maximum (FWHM) measured using X-ray diffraction (XRD).

The single crystalline piezoelectric material may include aluminum nitride (AlN), aluminum nitride doped with scandium (ScAlN), zinc oxide (ZnO), or lead zirconate titanate (PZT).

The FBAR structure may further include a first insulating layer disposed below the cavity; a second insulating layer disposed above the bottom cap wafer; and a metal bonding layer bonding the first insulating layer with the second insulating layer.

The metal bonding layer may include at least a first metal bonding layer and a second metal bonding layer.

A combination of materials of the first metal bonding layer and the second metal bonding layer may be selected from a group of gold-gold (Au—Au), aluminum-copper (Al—Cu), copper-copper (Cu—Cu), gold-silver (Au—Ag), copper-tin (Cu—Sn), aluminum-germanium (Al—Ge), gold-silicon (Au—Si), gold-germanium (Au—Ge), gold-tin (Au—Sn), copper-tin (Cu—Sn), and gold-indium (Au—In).

The FBAR structure may further include a ground contact layer electrically connecting the metal bonding layer to ground.

The FBAR structure may further include a ground contact window formed in the first insulating layer and the piezoelectric layer, and exposing the metal bonding layer. The ground contact layer may be electrically connected to the metal bonding layer via the ground contact window.

The first insulating layer and the second insulating layer may include silicon oxide ($SiO_2$) or silicon carbide (SiC).

The FBAR structure may further include a top passivation layer disposed above the top electrode, and a bottom passivation layer disposed below the bottom electrode.

The top passivation layer and the bottom passivation layer may include silicon nitride (SiN) or aluminum nitride (AlN).

The FBAR structure may further include a boundary layer surrounding the cavity.

The boundary layer may include silicon (Si), silicon nitride (SiN), aluminum nitride (AlN), polysilicon, amorphous silicon, or a stacked combination of two or more of those materials.

The FBAR structure may further include a bottom electrode contact layer electrically connected with the bottom electrode, and a top electrode contact layer electrically connected with the top electrode.

The FBAR structure may further include a bottom electrode contact window formed in the piezoelectric layer and exposing the bottom electrode. The bottom electrode contact layer may be electrically connected with the bottom electrode via the bottom electrode contact window.

Each one of the bottom electrode contact layer and the top electrode contact layer may include aluminum (Al), copper (Cu), gold (Au), titanium (Ti), tungsten (W), platinum (Pt), or a stacked combination of two or more of those materials.

Each one of the top electrode and the bottom electrode may include molybdenum (Mo), aluminum (Al), copper (Cu), platinum (Pt), tantalum (Ta), tungsten (W), palladium (Pd), ruthenium (Ru), or a stacked combination of two or more of those materials.

The bottom cap wafer may include silicon (Si), silicon carbide (SiC), sapphire ($Al_2O_3$), or a stacked combination of two or more of those materials.

A projection of at least one side of the bottom electrode may be located within the cavity.

A projection of at least one edge of the top electrode may be located within the cavity.

Embodiments of the present disclosure also provide a method for fabricating a film bulk acoustic resonator (FBAR) structure. The method may include obtaining a substrate; growing a buffer layer on the wafer; growing an epitaxial layer on the buffer layer; and growing a piezoelectric layer on the epitaxial layer.

A lattice structure of a material of the buffer layer may match a lattice structure of a material of the epitaxial layer, and the lattice structure of the material of the epitaxial layer may match a lattice structure of a material of the piezoelectric layer.

The substrate may be formed of silicon (Si), silicon carbide (SiC), or sapphire ($Al_2O_3$).

The buffer layer may be formed of gallium nitride (GaN), or aluminum nitride (AlN).

The buffer layer may be grown on the wafer by using a metal organic chemical vapor deposition (MOCVD) process.

The epitaxial layer may be formed of gallium nitride (GaN), or aluminum nitride (AlN).

The epitaxial layer may be grown on the buffer layer by using a MOCVD process.

The method may further include forming a bottom electrode on the piezoelectric layer; forming a sacrificial island on the bottom electrode; and forming a boundary layer on the sacrificial island.

The method may further include forming a first insulating layer on the boundary layer.

The method may further include providing a bottom cap wafer with a second insulating layer formed on the bottom cap wafer; and bonding the second insulating layer with the first insulating layer via a metal bonding layer.

The method may further include removing the wafer, the buffer layer, and the epitaxial layer to expose a surface of the piezoelectric layer.

The method may further include forming a top electrode on the exposed surface of the piezoelectric layer.

The method may further include forming a top passivation layer on the top electrode; forming a top electrode window in the top passivation layer to expose the top electrode; and forming a top electrode contact layer in the top electrode window to electrically connect to the top electrode.

The method may further include forming a ground contact window in the first insulating layer and the piezoelectric layer to expose the metal bonding layer; and forming a ground contact layer in the ground contact window to electrically connect to the metal bonding layer.

The method may further include forming a bottom electrode contact window in the piezoelectric layer to expose the bottom electrode; and forming a bottom electrode contact layer in the bottom electrode contact window to electrically connect to the bottom electrode.

The method may further include removing the sacrificial island to form a cavity.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1:
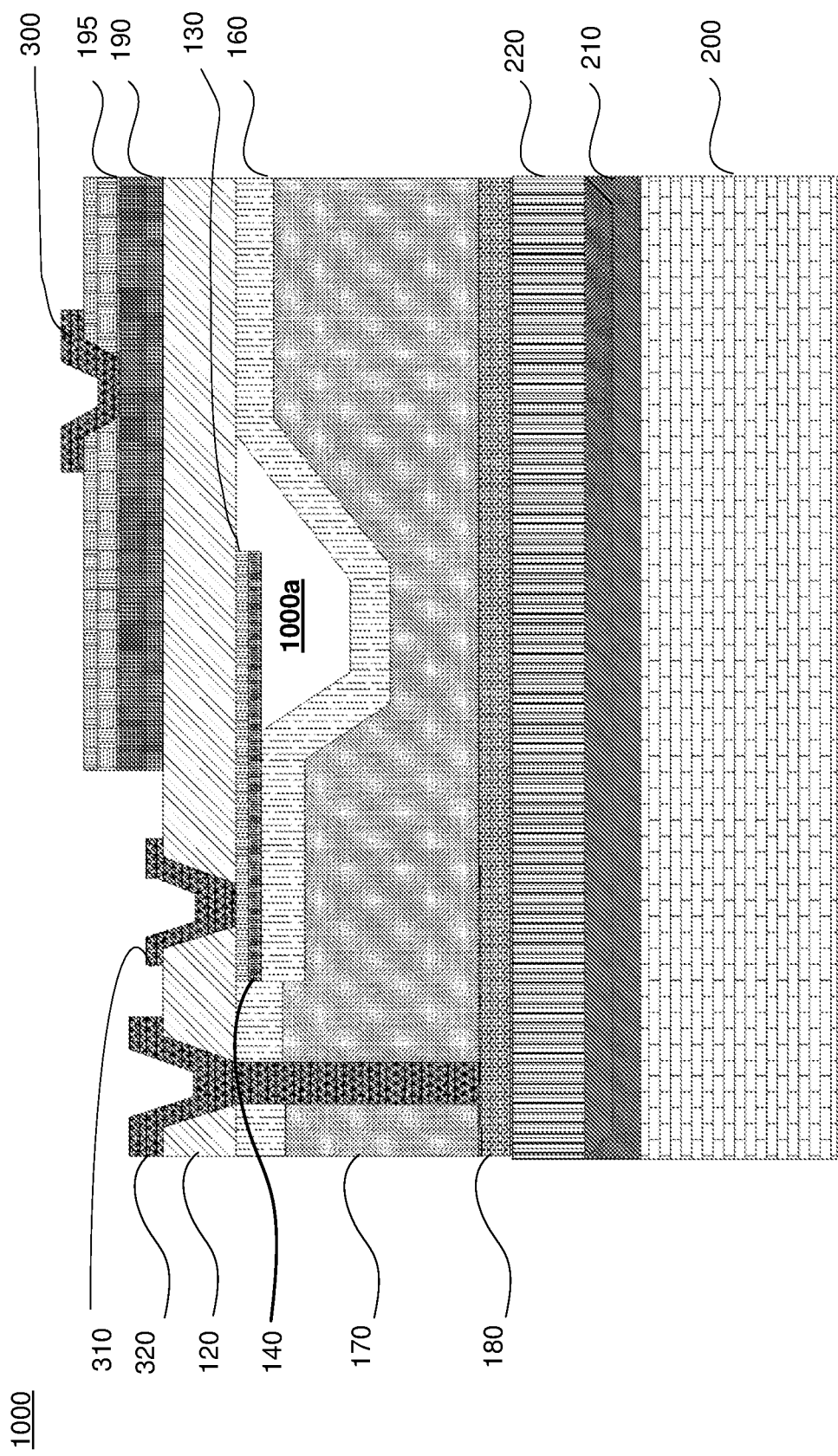
FIG. 1 is a cross-sectional view of a film bulk acoustic resonator (FBAR) structure, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "front," "back," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

A traditional fabrication method for a bulk acoustic wave (BAW) filter uses silicon as a substrate, grows an electrode layer on the silicon substrate, and grows a piezoelectric layer, such as aluminum nitride (AlN), etc., on the electrode layer. Then, etching and wafer bonding processes are performed to form cavities and resonators. However, the lattice structures of silicon, the electrode material of the electrode layer, and the piezoelectric material of the piezoelectric layer, may not be matched. For example, molybdenum (Mo), which is commonly used as the electrode material, has a body-centered cubic (BCC) crystal structure with a lattice constant of a=3.147 Å, while AlN, which is commonly used as the piezoelectric material, has a wurtzite structure with lattice constants of a=3.11 Å, c=4.978 Å. Additionally, the electrode layer has a polycrystalline structure, and therefore the piezoelectric layer grown on the electrode layer also has a polycrystalline structure. As a result, the piezoelectric material is usually of low quality, having a crystallinity of more than 1.3 degrees, or even more than 10.6 degrees, at Full Width Half Maximum (FWHM) measured using X-ray diffraction (XRD).

Embodiments of the present disclosure provide a new approach for growing piezoelectric layer, which includes growing a buffer layer (e.g., AlN buffer layer) on a silicon wafer, growing an epitaxial layer (e.g., GaN epitaxial layer) on the buffer layer, and growing a piezoelectric layer (e.g., AlN or scandium doped aluminum nitride (ScAlN)) on the epitaxial layer. GaN has a wurtzite structure having lattice constants of a=3.189 Å, c=5.185 Å). Because the GaN lattice structure and lattice constant are very close to those of AlN and ScAlN, and the GaN epitaxial layer has single crystalline structure, very high quality single crystalline AlN or ScAlN layer can be grown on the GaN epitaxial layer. The single crystalline AlN or ScAlN layer grown using the approach according to the embodiments of the present disclosure may have a crystallinity of less than 0.5 degrees at FWHM measured using XRD, thereby improving the heat dissipation efficiency of a BAW resonator including such single crystalline AlN or ScAlN layer.

On the other hand, the stress of the AlN buffer layer/GaN epitaxial layer formed on the silicon wafer may be relatively large, resulting in large warpage (deformation) of the silicon wafer, causing difficulty in a subsequent $SiO_2$—Si bonding process, which requires less wafer warpage. According to embodiments of the present disclosure, a metal fusion bonding process, which can tolerate large wafer warpage, is performed to overcome bonding difficulties. However, a metal bonding layer introduced by the metal fusion bonding process, may degrade the performance of the BAW resonator to be significantly. In order to avoid the negative effects of the metal bonding layer on the performance of the BAW resonator, the BAW resonator of the embodiments of the present disclosure is provided with a grounding through hole to ground the metal bonding layer.

FIG. 1 is a cross-sectional view of a film bulk acoustic resonator (FBAR) structure 1000, according to an embodiment of the present disclosure. As illustrated in FIG. 1, FBAR structure 1000 includes a bottom cap wafer 200, a piezoelectric layer 120 disposed on bottom cap wafer 200, a bottom electrode 130 disposed below piezoelectric layer 120, a top electrode 190 disposed above piezoelectric layer 120, and a cavity 1000*a* disposed below bottom electrode 130. In some embodiments, a projection of at least one edge of bottom electrode 130 is located within cavity 1000*a*. Alternatively or additionally, in some embodiments, a projection of at least one edge of top electrode 190 is located within cavity 1000*a*.

Piezoelectric layer 120 includes a single crystalline piezoelectric material. A crystallinity of the single crystalline piezoelectric material may be less than 0.5 degrees at Full Width Half Maximum (FWHM) measured using X-ray diffraction (XRD). The single crystalline piezoelectric material may include aluminum nitride (AlN), aluminum nitride doped with scandium (ScAlN), zinc oxide (ZnO), or lead zirconate titanate (PZT).

Bottom cap wafer 200 may include a material such as, for example, silicon (Si), glass ($SiO_2$), or sapphire ($Al_2O_3$).

Top and bottom electrodes 190 and 130 may include any suitable conductive material, including various metal materials with conductive properties such as molybdenum (Mo), aluminum (Al), copper (Cu), platinum (Pt), tantalum (Ta), tungsten (W), palladium (Pd), ruthenium (Ru), etc., or a stacked combination of two or more of those conductive metal materials.

As illustrated in FIG. 1, a top passivation layer 195 is disposed above, and covers a top surface of top electrode 190. A bottom passivation layer 140 is disposed below, and covers a lower surface of, bottom electrode 130. Top passivation layer 195 and bottom passivation layer 140 may include an electrically insulating material such as silicon nitride (SiN) or aluminum nitride (AlN).

Cavity 1000*a* is obtained by removing a sacrificial island (not illustrated in FIG. 1). The sacrificial island may include silicon oxide. A boundary of the removal of the sacrificial island is defined by a boundary layer 160 (also referred-to as an "etch stop layer"), which is disposed below piezoelectric layer 120 and surrounds the sacrificial island before the sacrificial island is removed. Boundary layer 160 may include one or more insulating materials such as silicon (Si), silicon nitride (SiN), aluminum nitride (AlN), polysilicon, or amorphous silicon, or a stacked combination of two or more of those materials.

A first insulating layer 170 is disposed below boundary layer 160. A second insulating layer 210 is disposed above bottom cap wafer 200. A metal bonding layer is disposed between first insulating layer 170 and second insulating layer 210 for bonding first insulating layer 170 with second insulating layer 210. The metal bonding layer includes at least a first metal bonding layer 180 and a second metal bonding layer 220. A combination of the materials of first metal bonding layer 180 and second metal bonding layer 220 may be selected from a group of gold-gold (Au—Au), aluminum-copper (Al—Cu), copper-copper (Cu—Cu), gold-silver (Au—Ag), copper-tin (Cu—Sn), aluminum-germanium (Al—Ge), gold-silicon (Au—Si), gold-germanium (Au—Ge), gold-tin (Au—Sn), copper-tin (Cu—Sn), and gold-indium (Au—In). For example, first metal bonding layer 180 may be formed of Au, and second metal bonding layer 220 may be formed of Au. Alternatively, first metal bonding layer 180 may be formed of Al, and second metal bonding layer 220 may be formed of Cu.

A top electrode contact layer 300 is disposed above top passivation layer 195 and is electrically connected to top electrode 190, via a top electrode contact window formed through top passivation layer 195. A bottom electrode contact layer 310 is disposed above piezoelectric layer 120 and is electrically connected to bottom electrode 130 via a bottom electrode contact window formed through piezoelectric layer 120. A ground contact layer 320 is disposed above piezoelectric layer 120 and is electrically connected to first metal bonding layer 180 via a contact window formed through piezoelectric layer 120, boundary layer 160, and first insulating layer 170. Ground contact layer 320 may be connected to ground, such that first metal bonding layer 180 is electrically connected to ground. Top electrode contact layer 300, bottom electrode contact layer 310, and ground contact layer 320 may include various metals, such as aluminum (Al), copper (Cu), gold (Au), titanium (Ti), tungsten (W), platinum (Pt), etc., or a stacked combination of two or more of those metals.

Figure 2:
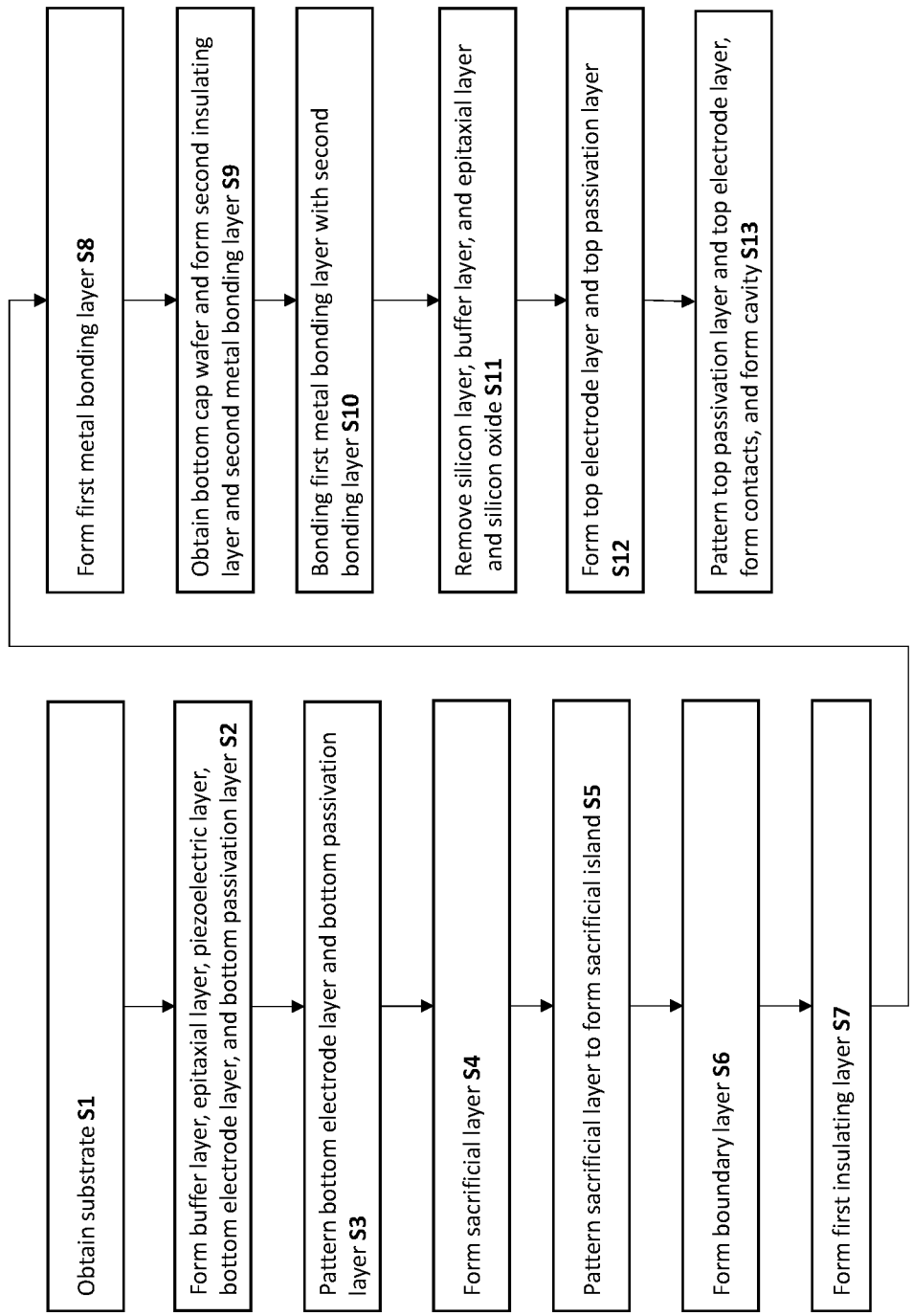
FIG. 2 is a flow chart of a process of fabricating a FBAR structure according to an embodiment of the present invention.

FIG. 2 is a flow chart of a process of fabricating a FBAR structure according to an embodiment of the present disclosure. FIGS. 3-15 are cross-sectional views of structures formed in steps S1-S13 of the process of FIG. 2, according to an embodiment of the present disclosure.

Figure 3:
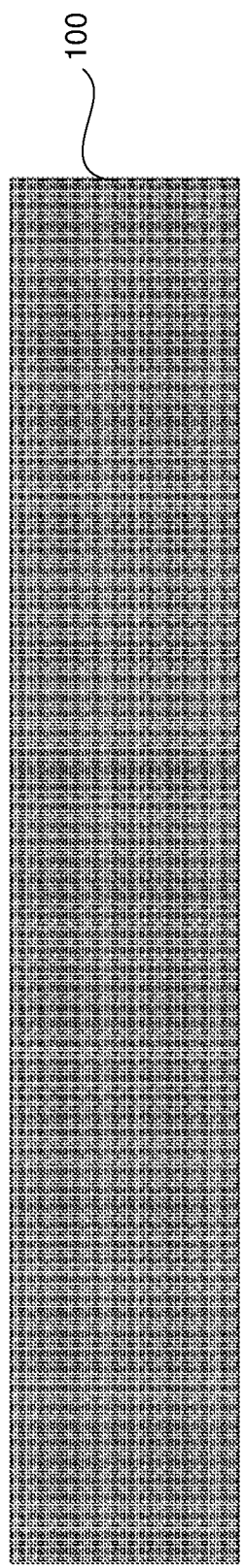
FIGS. 3-15 are cross-sectional views of structures formed in the process of FIG. 2, according to embodiments of the present disclosure.

As illustrated in FIG. 3, in step S1, a substrate 100 is obtained. The material of the substrate 100 may be silicon (Si), silicon carbide (SiC), or sapphire ($Al_2O_3$).

Figure 4:
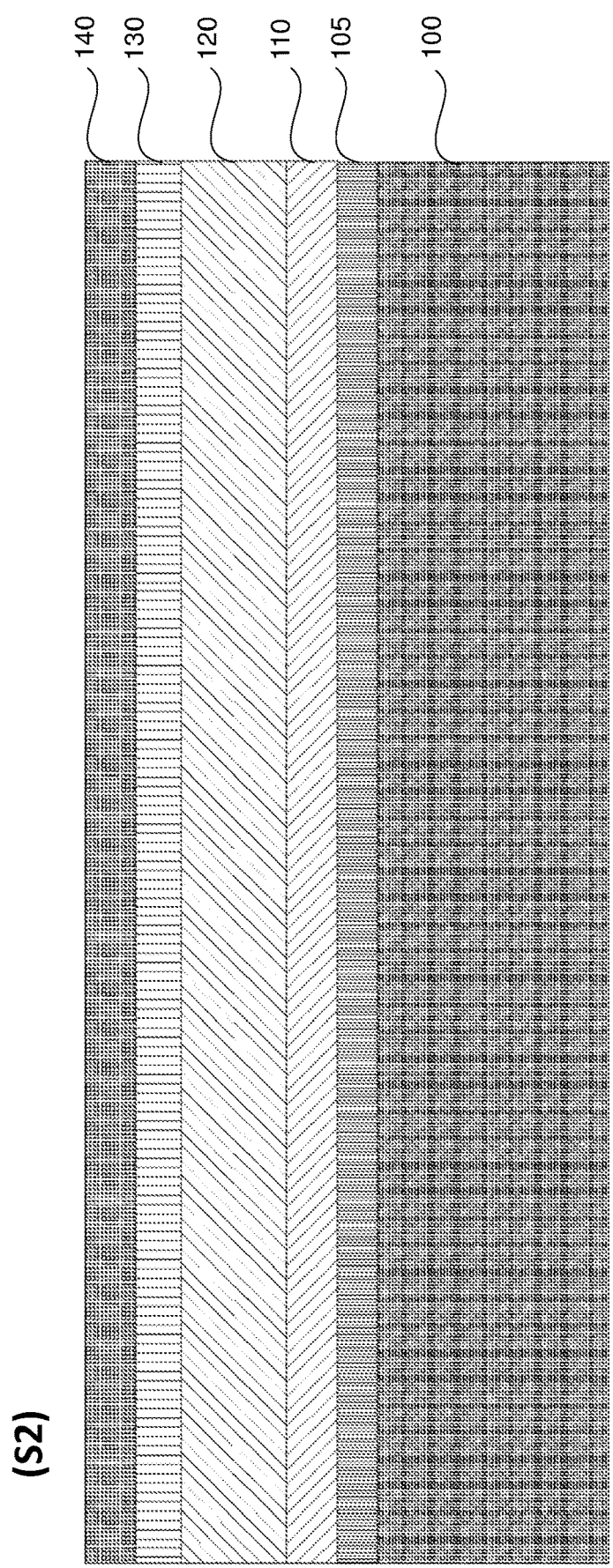

As illustrated in FIG. 4, in step S2, a buffer layer 105 is grown on substrate 100 by using, for example, a metal organic chemical vapor deposition (MOCVD) process. Next, an epitaxial layer 110 is grown on buffer layer 105 by using, for example, a MOCVD process. Afterwards, piezoelectric layer 120 is grown on epitaxial layer 110 by using, for example, a physical vapor deposition (PVD) process. Buffer layer 105 may be a single crystal layer, and may be formed of a material having a lattice structure that matches the material of epitaxial layer 110 or piezoelectric layer 120. For example, buffer layer 105 may be formed of gallium nitride (GaN), or aluminum nitride (AlN), etc. The purpose of buffer layer 105 is to grow a high-quality single crystal epitaxial layer 110. If epitaxial layer 110 is directly grown on substrate 100, epitaxial layer 110 might not have a single crystalline structure due to the lattice mismatch between the materials of epitaxial layer 110 and substrate 100. Epitaxial layer 110 may be formed of a material having a lattice structure that matches the material of piezoelectric material layer 120. For example, epitaxial layer 110 may be formed of gallium nitride (GaN), or aluminum nitride (AlN), etc. The purpose of epitaxial layer 110 is to grow a high-quality single crystal piezoelectric layer 120. Thus, according to the embodiments of the present disclosure, piezoelectric layer 120 is grown on epitaxial layer 110, which is grown on buffer layer 105 grown on substrate 100, and the lattice structures of the materials of buffer layer 105 and epitaxial layer 110 match each other, and match that of piezoelectric layer 120. Therefore, piezoelectric layer 120 formed according to the embodiments of the present disclosure may be a high-quality single crystal structure.

In addition, as illustrated in FIG. 4, in step S2, after piezoelectric layer 120 is obtained, a bottom electrode layer 130 and a bottom passivation layer 140 are sequentially deposited on piezoelectric layer 120. The material of bottom electrode layer 130 may be any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. Bottom passivation layer 140 may be made of one or more non-conductive materials such as silicon nitride (SiN) and aluminum nitride (AlN).

Figure 5:
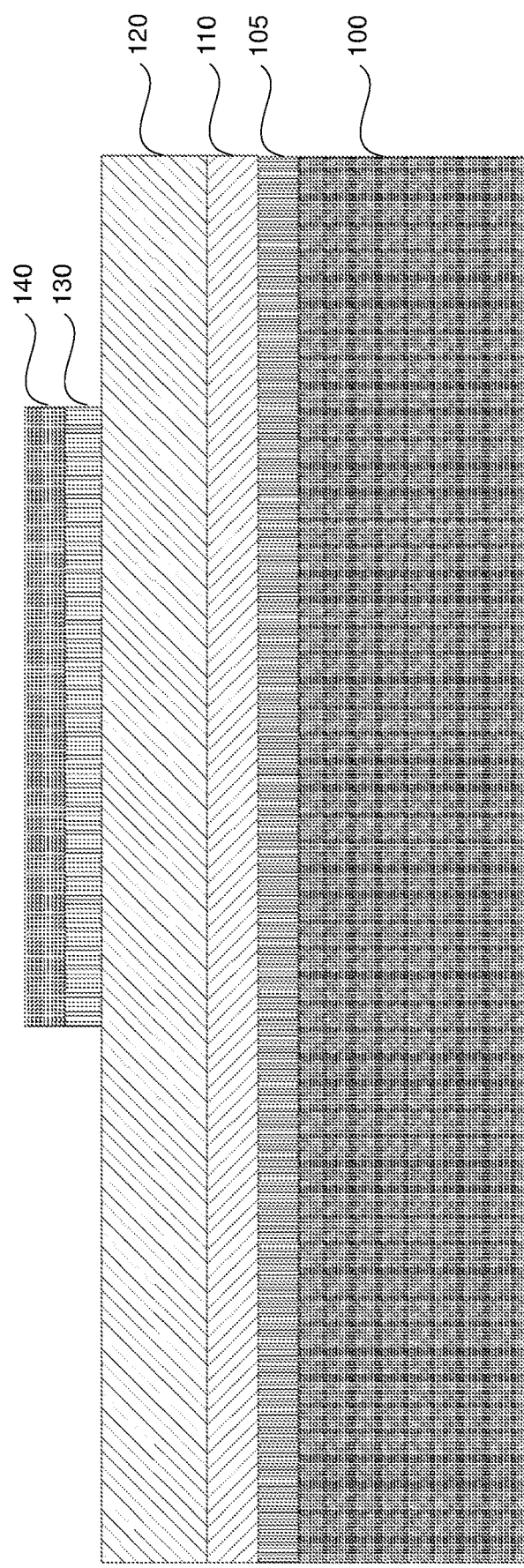

As illustrated in FIG. 5, in step S3, bottom electrode layer 130 and bottom passivation layer 140 are patterned and etched to form bottom electrode 130 and patterned bottom passivation layer 140. The etching process may be a wet chemical etching process, a plasma port etching process, or a combination thereof. This step allows for precise patterning of bottom electrode 130 of the FBAR structure.

Figure 6:
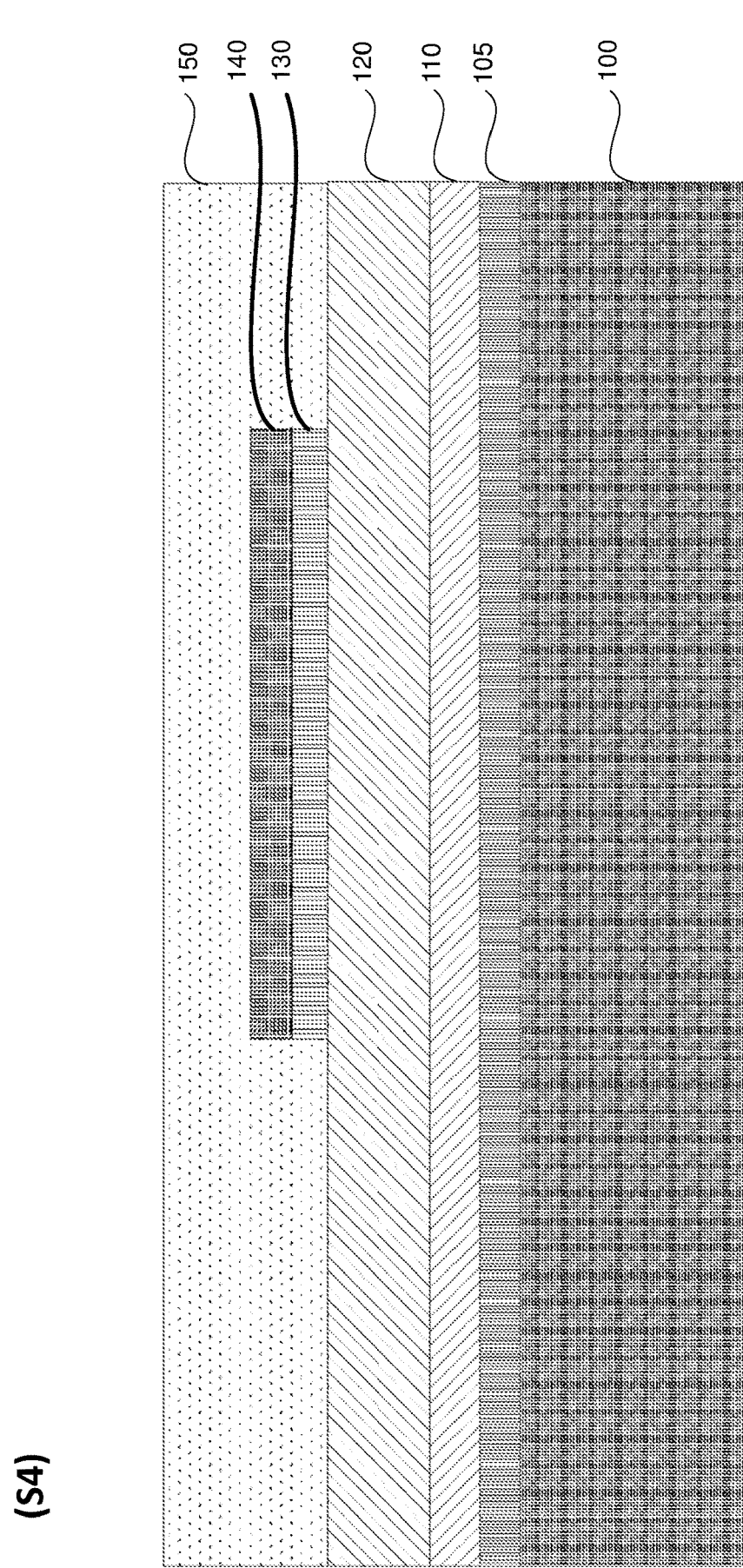

As illustrated in FIG. 6, in step S4, a sacrificial layer 150 is deposited on the structure illustrated in FIG. 5. Sacrificial layer 150 is used to form cavity 1000a of the FBAR structure. Sacrificial layer 150 may include at least one of various types of silicon oxide material, such as pure silicon oxide, phosphor silicate glass (PSG), boron phosphor silicate glass (BPSG), spin on glass (SOG), or fluorinated silicate glass (FSG). Sacrificial layer 150 may be deposited by using a chemical vapor deposition (CVD) process, a physical vapor deposition (PVD) process, or a combination of both. After depositing sacrificial layer 150, a top surface of sacrificial layer 150 may be planarized and polished by using, for example, a chemical mechanical polishing (CMP) process.

Figure 7:
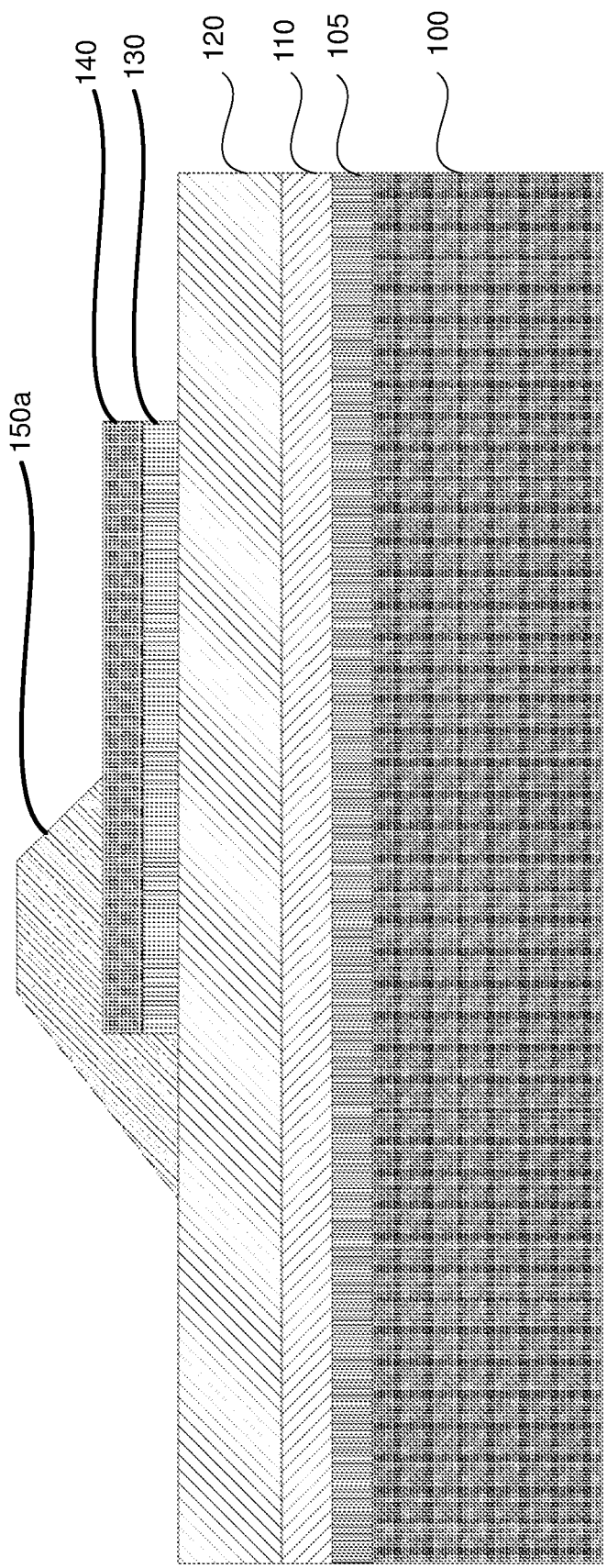

As illustrated in FIG. 7, in step S5, sacrificial layer 150 is patterned and etched to form a sacrificial island 150a. The material of sacrificial island 150a will be removed in a subsequent release etching process, thereby forming cavity 1000a of the FBAR structure. The etching process may be a wet chemical etching process, a plasma etching process, or a combination of those two processes.

Figure 8:
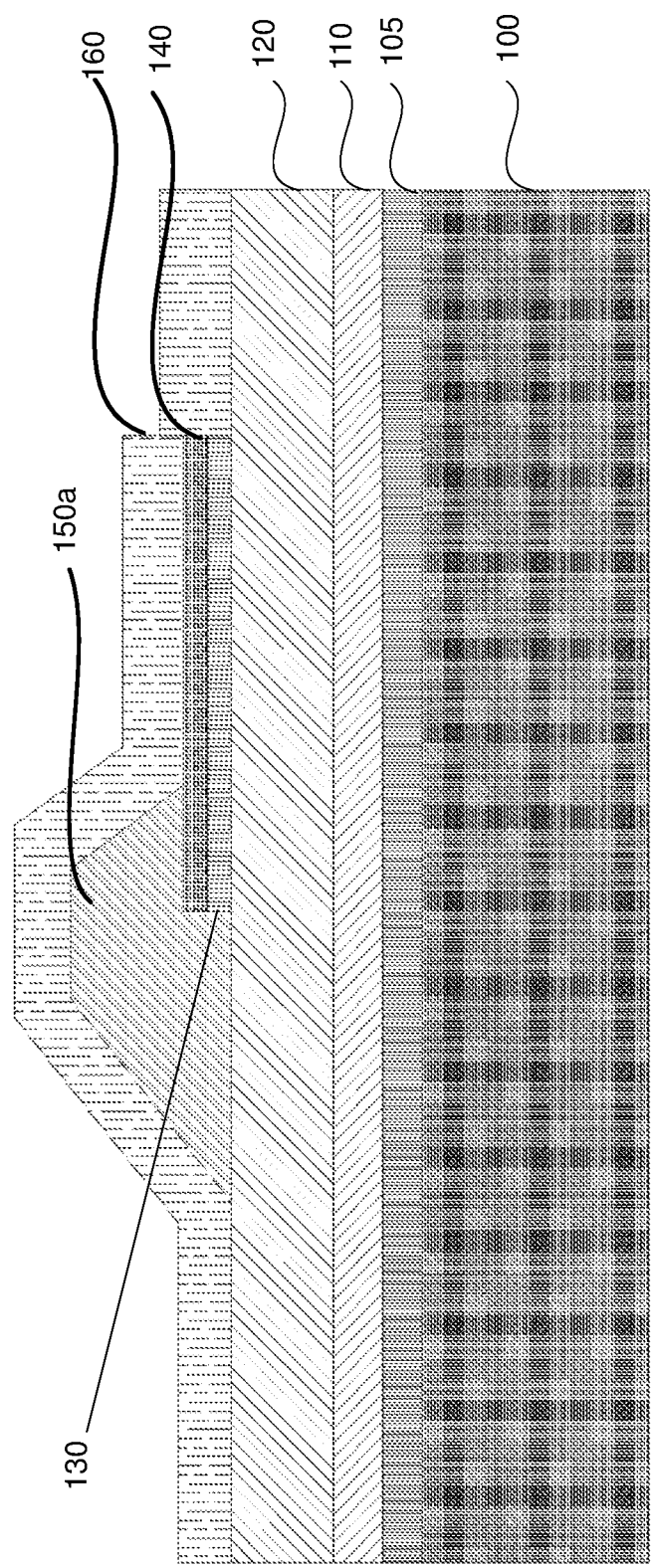

As illustrated in FIG. 8, in step S6, boundary layer 160 is deposited on the structure of FIG. 7. A portion of boundary layer 160 that surrounds sacrificial island 150a functions as an etch stop layer during the subsequent release etching process for removing sacrificial island 150a to form cavity 1000a. Boundary layer 160 may include a non-conductive materials such as silicon (Si), silicon nitride (SiN), aluminum nitride (AlN), polysilicon, amorphous silicon, or a stacked combination of two or more of those materials.

Figure 9:
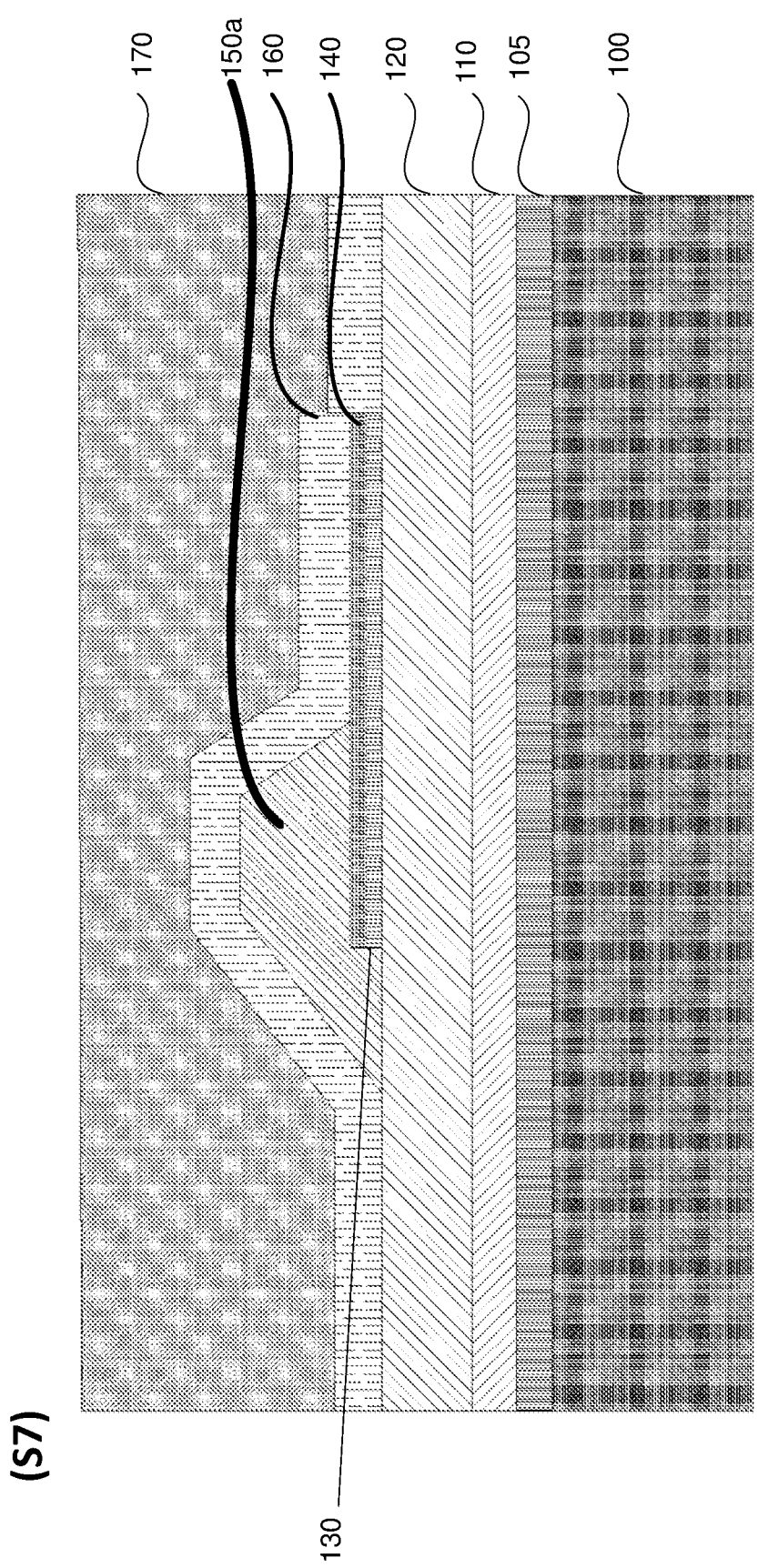

As illustrated in FIG. 9, in step S7, first insulating layer 170 is deposited on the structure illustrated in FIG. 8. Then, the top surface of first insulating layer 170 is planarized and polished. First insulating layer 170 may be deposited by using a CVD process, a PVD process, or a combination of those two processes. The material of first insulating layer 170 may be silicon oxide ($SiO_2$), or silicon carbide (SiC), etc. The surface planarization and polishing may be performed by using, for example, a CMP process.

Figure 10:
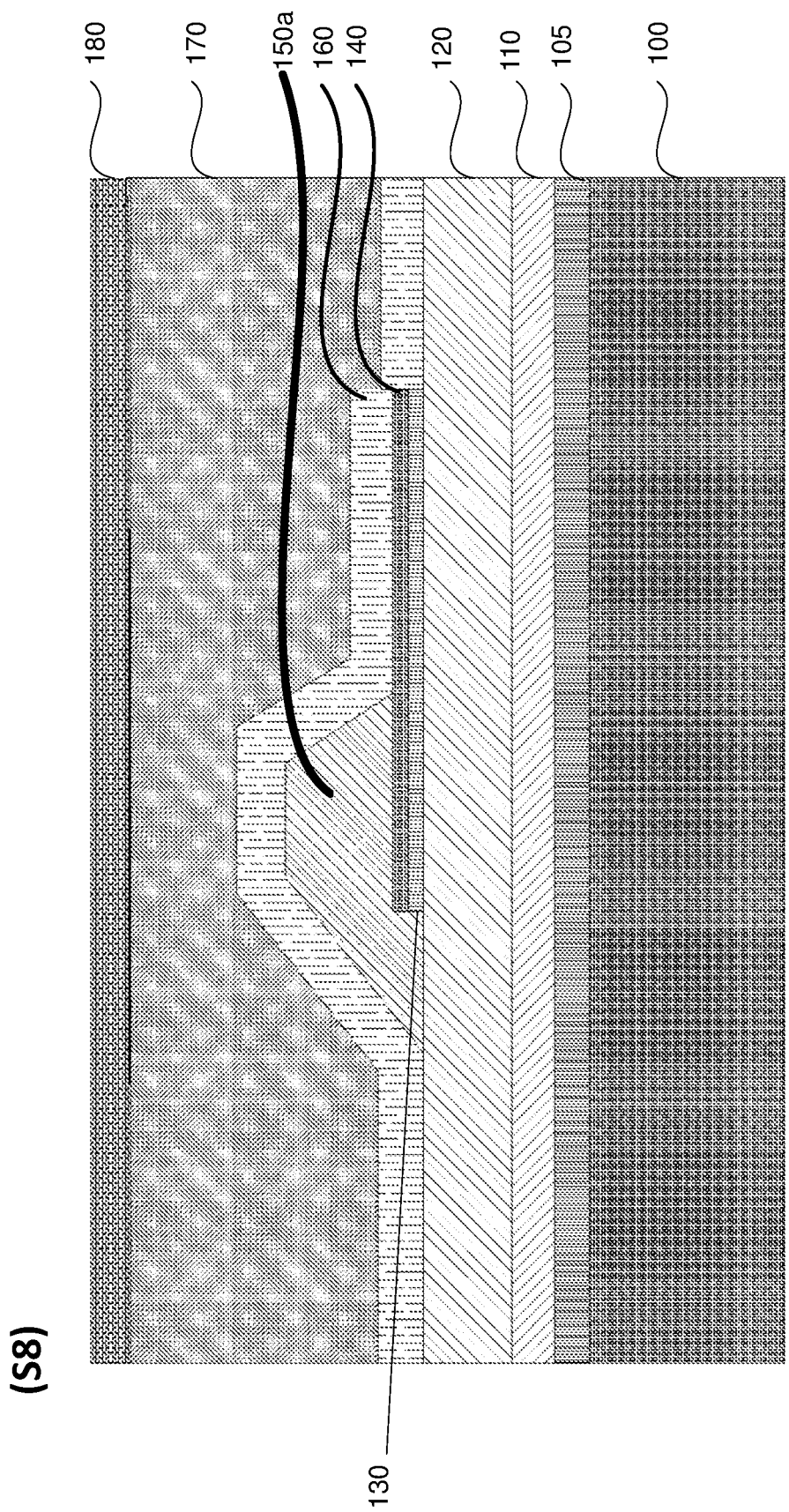

As illustrated in FIG. 10, in step S8, first metal bonding layer 180 is deposited on first insulating layer 170. Before the deposition of first metal bonding layer 180, metals such as titanium (Ti) and nickel (Ni) may be formed on first insulating layer 170 in order to increase the adhesion between first insulating layer 170 and first metal bonding layer 180. First metal bonding layer 180 may include a material that corresponds to the material of second metal bonding layer 220 to achieve metal bonding. A combination of the materials of first metal bonding layer 180 and second metal bonding layer 220 may be selected from a group of gold-gold (Au—Au), aluminum-copper (Al—Cu), copper-copper (Cu—Cu), gold-silver (Au—Ag), copper-tin (Cu—Sn), aluminum-germanium (Al—Ge), gold-silicon (Au—Si), gold-germanium (Au—Ge), gold-tin (Au—Sn), copper-tin (Cu—Sn), and gold-indium (Au—In). For example, first metal bonding layer 180 may be formed of Au, and second metal bonding layer 220 may be formed of Au. Alternatively, first metal bonding layer 180 may be formed of Al, and second metal bonding layer 220 may be formed of Cu.

Figure 11:
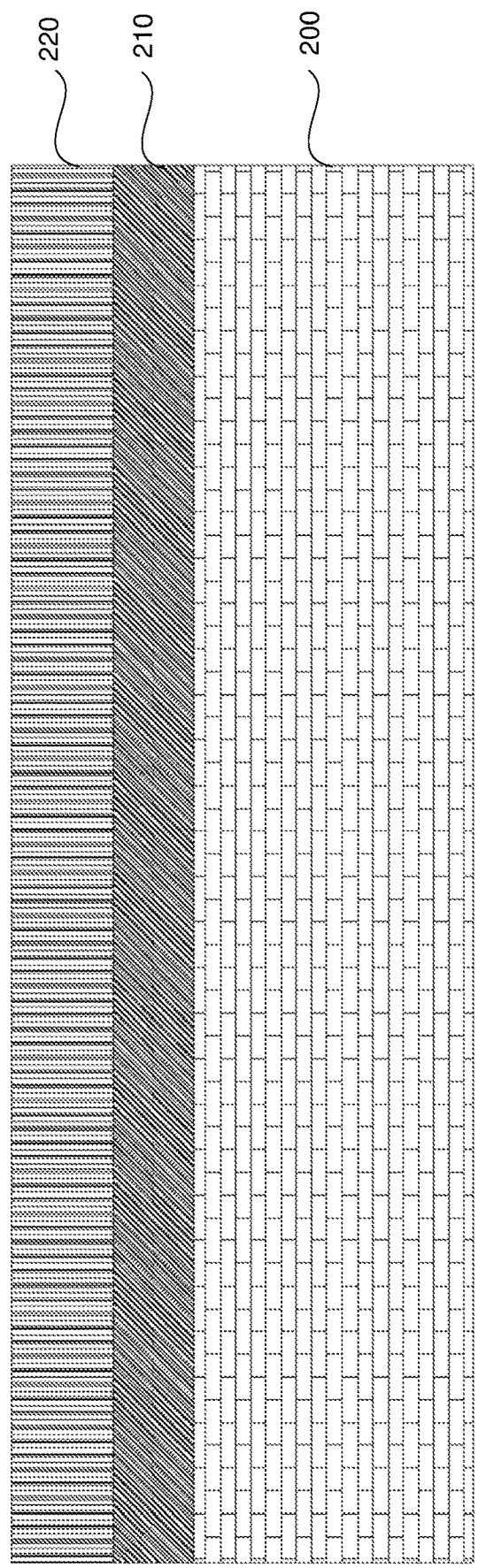

As illustrated in FIG. 11, in step S9, bottom cap wafer 200 is obtained. Second insulating layer 210 and second metal bonding layer 220 are sequentially deposited on bottom cap wafer 200. Before the deposition of second metal bonding layer 220, metals such as titanium (Ti) and nickel (Ni) may be formed on second insulating layer 210 in order to increase the adhesion between first insulating layer 170 and first metal bonding layer 180. Bottom cap wafer 200 may include a material such as silicon (Si), carbon silicon (SiC), aluminum oxide, quartz, glass, or sapphire ($Al_2O_3$). Second insulating layer 210 may be deposited by using a CVD process, a PVD process, or a combination of those two processes. The material of second insulating layer 210 may be silicon oxide ($SiO_2$), or silicon carbide (SiC), etc. As described previously, second metal bonding layer 220 may include a material that corresponds to the material of first metal bonding layer 180 to achieve metal bonding. A combination of the materials of first metal bonding layer 180 and second metal bonding layer 220 may be selected from a group of gold-gold (Au—Au), aluminum-copper (Al—Cu), copper-copper (Cu—Cu), gold-silver (Au—Ag), copper-tin (Cu—Sn), aluminum-germanium (Al—Ge), gold-silicon (Au—Si), gold-germanium (Au—Ge), gold-tin (Au—Sn), copper-tin (Cu—Sn), and gold-indium (Au—In).

Figure 12:
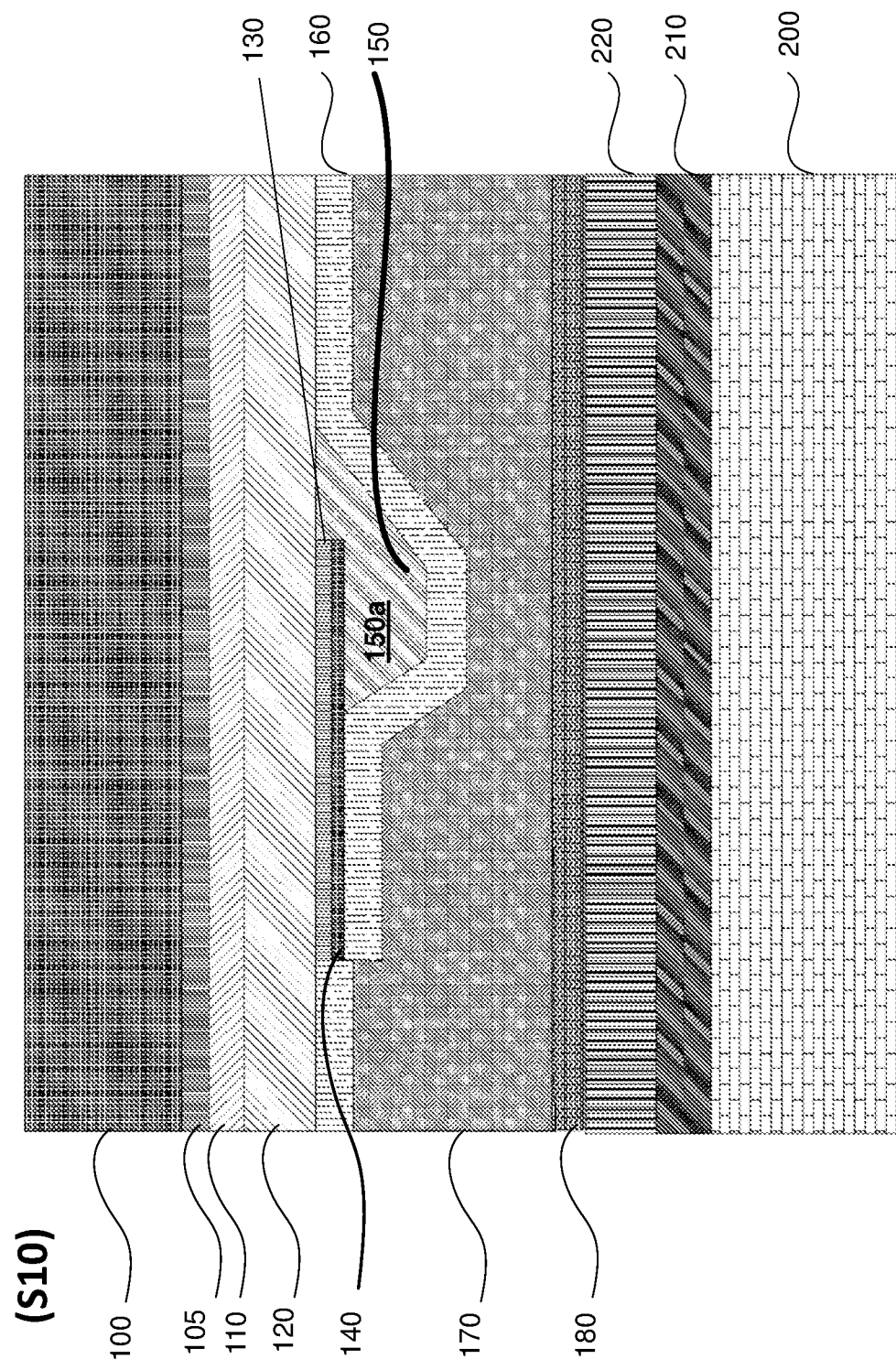

As illustrated in FIG. 12, in step S10, the structure illustrated in FIG. 10 is flipped over, and first metal bonding layer 180 and second metal bonding layer 220 are bonded together by using a metal bonding process. As a result, the structure formed on bottom cap wafer 200 and the structure formed on substrate 100 are combined. The metal bonding process may be achieved by one or more of eutectic bonding, anodic bonding, or thermal compression bonding.

Figure 13:
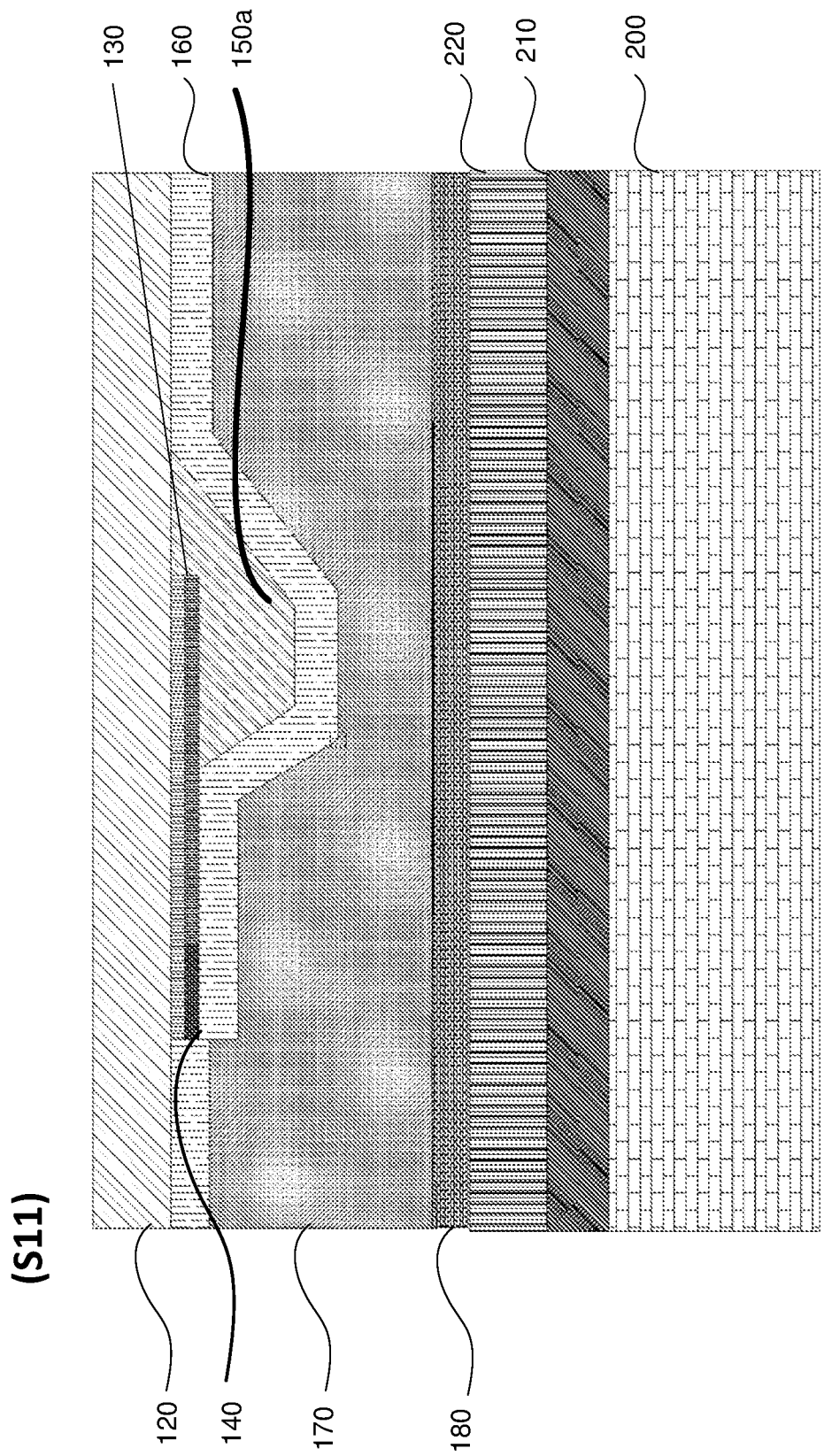

As illustrated in FIG. 13, in step S11, substrate 100, buffer layer 105, and epitaxial layer 110 are removed to expose piezoelectric layer 120. The removal of substrate 100 may be performed by a grinding process. The removal of buffer layer 105 and epitaxial layer 110 may be performed by a wet chemical etching process, a plasma dry etching process, or a combination of these two processes.

Figure 14:
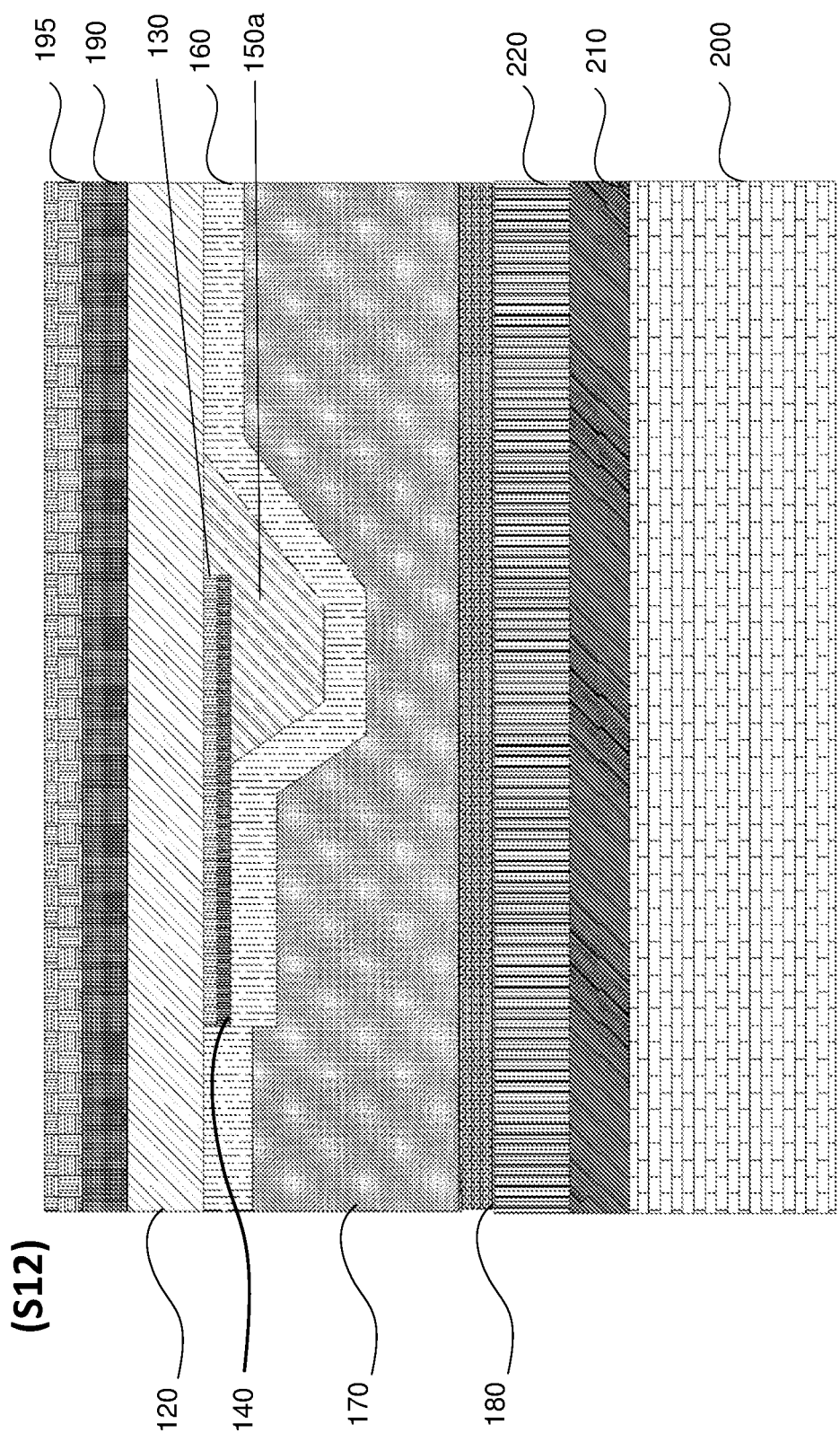

As illustrated in FIG. 14, in step S12, a top electrode layer 190 is deposited on piezoelectric layer 120, and top passivation layer 195 is deposited on top electrode layer 190. The material of top electrode layer 190 may be any suitable conductive material, such as various metal materials with conductive properties or a stack of several conductive metal materials, such as molybdenum (Mo), aluminum (Al), copper (Cu), platinum (Pt), Tantalum (Ta), tungsten (W), palladium (Pd), ruthenium (Ru), etc. The material of top passivation layer 195 can be silicon nitride (SiN), aluminum nitride (AlN), silicon oxide ($SiO_2$), silicon oxynitride (SiNO), etc., or a stacked combination of those materials.

Figure 15:
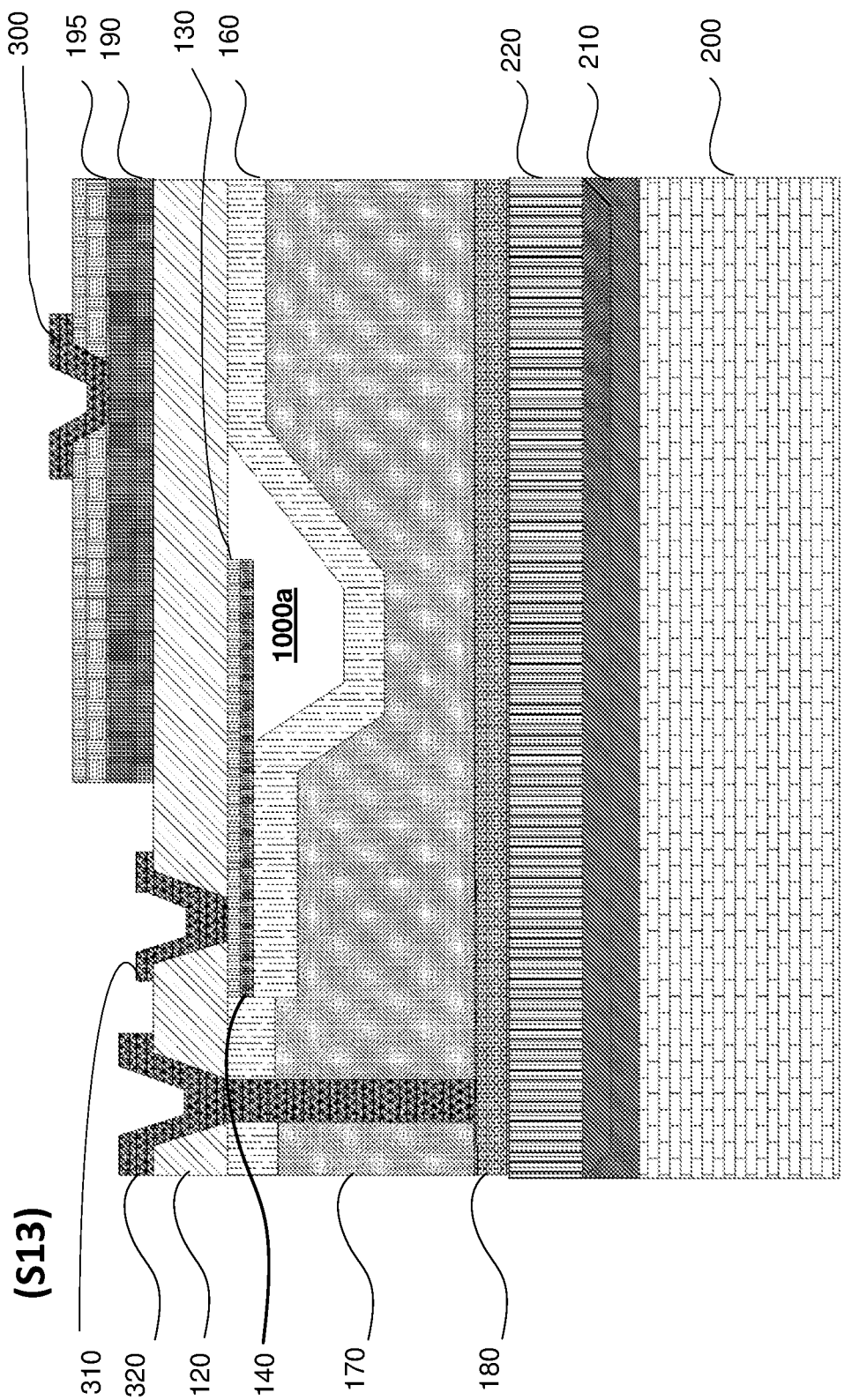

As illustrated in FIG. 15, in step S13, top electrode layer 190 and top passivation layer 195 are patterned by etching, to form patterned top passivation layer 195, top electrode 190. Then, the patterned top passivation layer 195, piezoelectric layer 120, boundary layer 160, and first insulating layer 170 are patterned by etching, for a top electrode contact window exposing top electrode 190, a bottom electrode contact window exposing bottom electrode 130, and a ground contact window exposing first metal contact layer 180. In some embodiments, a different etching sequence may be used to form the contact windows, which is not limited in the present disclosure. For example, passivation layer 195 may be first patterned to form the top electrode contact window; then, piezoelectric layer 120 may be patterned to form the bottom electrode contact window and a part of the ground contact window; and lastly, boundary layer 160 and first insulating layer 170 are patterned to form the remining part of the ground contact window.

Next, top electrode contact layer 300 is formed in the top electrode contact window to be electrically connected to top electrode 190. Bottom electrode contact layer 310 is formed in the bottom electrode contact window to be electrically connected to bottom electrode 130. Ground contact layer 320 is formed in the ground contact window to be electrically connected to first metal bonding layer 180. The purpose of ground contact layer 320 is to connect first metal bonding layer 180 to ground, thereby reducing or eliminating parasitic capacitance introduced by first metal bonding layer 180 and second metal bonding layer 220. The material of top electrode contact layer 300, bottom electrode contact layer 310, and ground contact layer 320 may be metal materials, such as aluminum (Al), copper (Cu), gold (Au), titanium (Ti), tungsten (W), platinum (Pt), etc., or a stacked combination of two or more of those materials.

Afterwards, sacrificial island 150a is etched and released to form cavity 1000a by using a release etching process. The etching of sacrificial island 150a is stopped at boundary layer 160. The release etching process may be performed by using hydrofluoric acid solution wet etching, buffered oxide etchant (BOE) solution wet etching, or hydrofluoric acid vapor corrosion, or a combination of those processes. As a result, FBAR structure 1000 illustrated in FIG. 1 is formed.

According to the embodiments of the present disclosure, a high-quality single crystal AlN piezoelectric layer can be obtained by growing a GaN epitaxial layer on a silicon wafer, and then growing the AlN piezoelectric layer on the GaN epitaxial layer. The high-quality single crystal AlN piezoelectric layer improves the heat dissipation efficiency of a bulk acoustic wave resonator including the same. At the same time, the metal bonding method was selected to overcome the difficulty in bonding caused by the wafer warpage as a result of the introduction of gallium nitride epitaxial layer. In addition, the metal bonding layer is grounded in order to avoid the negative impact of the metal bonding layer on the performance.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A film bulk acoustic resonator (FBAR) structure, comprising:
   a bottom cap wafer;
   a piezoelectric layer disposed on the bottom cap wafer, the piezoelectric layer including a single crystalline piezoelectric material;
   a bottom electrode disposed below the piezoelectric layer;
   a top electrode disposed above the piezoelectric layer;
   a cavity disposed below the bottom electrode;
   a first insulating layer disposed below the cavity;
   a second insulating layer disposed above the bottom cap wafer; and
   a metal bonding layer bonding the first insulating layer with the second insulating layer.

2. The FBAR structure of claim 1, wherein the single crystalline piezoelectric material includes aluminum nitride (AlN), aluminum nitride doped with scandium (ScAlN), zinc oxide (ZnO), or lead zirconate titanate (PZT).

3. The FBAR structure of claim 1, wherein the metal bonding layer includes at least a first metal bonding layer and a second metal bonding layer.

4. The FBAR structure of claim 3, wherein a combination of materials of the first metal bonding layer and the second metal bonding layer is selected from a group of gold-gold (Au—Au), aluminum-copper (Al—Cu), copper-copper (Cu—Cu), gold-silver (Au—Ag), copper-tin (Cu—Sn), aluminum-germanium (Al—Ge), gold-silicon (Au—Si), gold-germanium (Au—Ge), gold-tin (Au—Sn), copper-tin (Cu—Sn), and gold-indium (Au—In).

5. The FBAR structure of claim 1, further comprising a ground contact layer electrically connecting the metal bonding layer to ground.

6. The FBAR structure of claim 5, further comprising a ground contact window formed in the first insulating layer and the piezoelectric layer, and exposing the metal bonding layer,
   wherein the ground contact layer is electrically connected to the metal bonding layer via the ground contact window.

7. The FBAR structure of claim 1, wherein the first insulating layer and the second insulating layer include silicon oxide ($SiO_2$) or silicon carbide (SiC).

8. The FBAR structure of claim 1, further comprising:
   a top passivation layer disposed above the top electrode; and
   a bottom passivation layer disposed below the bottom electrode.

9. The FBAR structure of claim 8, wherein the top passivation layer and the bottom passivation layer include silicon nitride (SiN) or aluminum nitride (AlN).

10. The FBAR structure of claim 1, further comprising a boundary layer surrounding the cavity.

11. The FBAR structure of claim 10, wherein the boundary layer includes silicon (Si), silicon nitride (SiN), aluminum nitride (AlN), polysilicon, amorphous silicon, or a stacked combination of two or more of those materials.

12. The FBAR structure of claim 1, further comprising:
    a bottom electrode contact layer electrically connected with the bottom electrode; and
    a top electrode contact layer electrically connected with the top electrode.

13. The FBAR structure of claim 12, further comprising:
    a bottom electrode contact window formed in the piezoelectric layer and exposing the bottom electrode, wherein the bottom electrode contact layer is electrically connected with the bottom electrode via the bottom electrode contact window.

14. The FBAR structure of claim 12, wherein each one of the bottom electrode contact layer and the top electrode contact layer includes aluminum (Al), copper (Cu), gold (Au), titanium (Ti), tungsten (W), platinum (Pt), or a stacked combination of two or more of those materials.

15. The FBAR structure of claim 1, wherein each one of the top electrode and the bottom electrode includes molybdenum (Mo), aluminum (Al), copper (Cu), platinum (Pt), tantalum (Ta), tungsten (W), palladium (Pd), ruthenium (Ru), or a stacked combination of two or more of those materials.

16. The FBAR structure of claim 1, wherein the bottom cap wafer includes silicon (Si), silicon carbide (SiC), sapphire ($Al_2O_3$), or a stacked combination of two or more of those materials.

17. The FBAR structure of claim 1, wherein a projection of at least one edge of the top electrode is located within the cavity.

18. The FBAR structure of claim 1, wherein a projection of at least one side of the bottom electrode is located within the cavity.

19. The FBAR structure of claim 1, wherein the single crystalline piezoelectric material has a crystallinity of less than 0.5 degrees at Full Width Half Maximum (FWHM) measured using X-ray diffraction (XRD).

\* \* \* \* \*